INVENTORS
KERN K. N. CHANG &
H. JOHN PRAGER
BY Eugene M. Whitacre
ATTORNEY

INVENTORS
KERN K. N. CHANG &
H. JOHN PRAGER
BY Eugene M. Whitacre
ATTORNEY 3,166,713

TUNNEL DIODE CONVERTER WITH FORWARD BIAS OF THE DIODE BY RECTIFICATION OF SIGNAL WAVE

Kern K. N. Chang, Princeton, and Hans John Prager, Maplewood, N.J., assignors to Radio Corporation of America, a corporation of Delaware Filed Feb. 24, 1961, Ser. No. 91,533
9 Claims. (Cl. 325—449)

This invention relates to frequency converters and more particularly to frequency converters employing negative resistance semiconductor diodes.

Negative resistance semiconductor diodes have recently been utilized in frequency converting circuits to provide conversion gain over a relatively broad bandwidth while maintaining good noise factors. The process of frequency conversion occurs in such circuits due to the nonlinear interaction of a modulated signal and a locally generated oscillatory wave in the diode. To achieve such a nonlinear interaction, the negative resistance diode is forward biased to operate near the current maximum or minimum points which define the negative resistance region.

Heretofore the forward biasing voltage for the diode has been obtained by providing an external D.C. biasing supply. Since the diode must be operated in its negative resistance region for at least a portion of the operating cycle in order to achieve conversion gain, such an external D.C. biasing circuit is susceptible to parasitic oscillations which adversely affect the operation of the frequency converter.

Accordingly it is an object of this invention to provide an improved frequency converter employing negative-resistance semiconductor diodes.

It is another object of this invention to provide an improved negative-resistance diode frequency converter of a relatively simple construction which is relatively immune to parasitic oscillations.

It is another object of this invention to provide an improved negative-resistance diode frequency converter which does not require an external D.-C. biasing supply for the diode.

A frequency converter in accordance with the invention includes a negative resistance, semiconductor diode which exhibits an average conductance that is greater for reverse bias voltages than for forward bias voltages and which also exhibits a negative resistance region in the forward bias direction. One type of negative resistance diode which satisfies these conditions is known as a tunnel diode.

The negative resistance diode is coupled to a source of R.-F. signals and to a source of oscillatory waves. The amplitude of the oscillatory waves is made sufficiently high so that rectification thereof by the diode causes a bias voltage to be developed across a load resistor coupled to the diode. Due to the reverse conductance characteristic of the diode, the resultant bias voltage is of a polarity to forward bias the diode. The value of the load resistor and the amplitude of the applied oscillatory waves is selected so that the resulting forward bias voltage causes the diode to operate in its nonlinear region which occurs at the transition of the current-voltage characteristic from a positive slope to a negative slope. Such biasing insures that the diode operates in the negative resistance region over a portion of the operating cycle so that a conversion gain is achieved.

A frequency converter in accordance with the invention eliminates the necessity for providing a separate biasing voltage supply and connections thereto. Consequently the frequency converter not only has a simple circuit configuration but is less susceptible to parasitic oscillations caused by the biasing supply connections across the negative resistance of the diode.

The novel features which are considered characteristic of this invention are set forth with particularity in the appended claims. This invention itself, however, both as to its organization and method of operation as well as additional objects and advantages thereof, will best be understood from the following description when read in conjunction with the accompanying drawing in which:

Figures 1, 2:
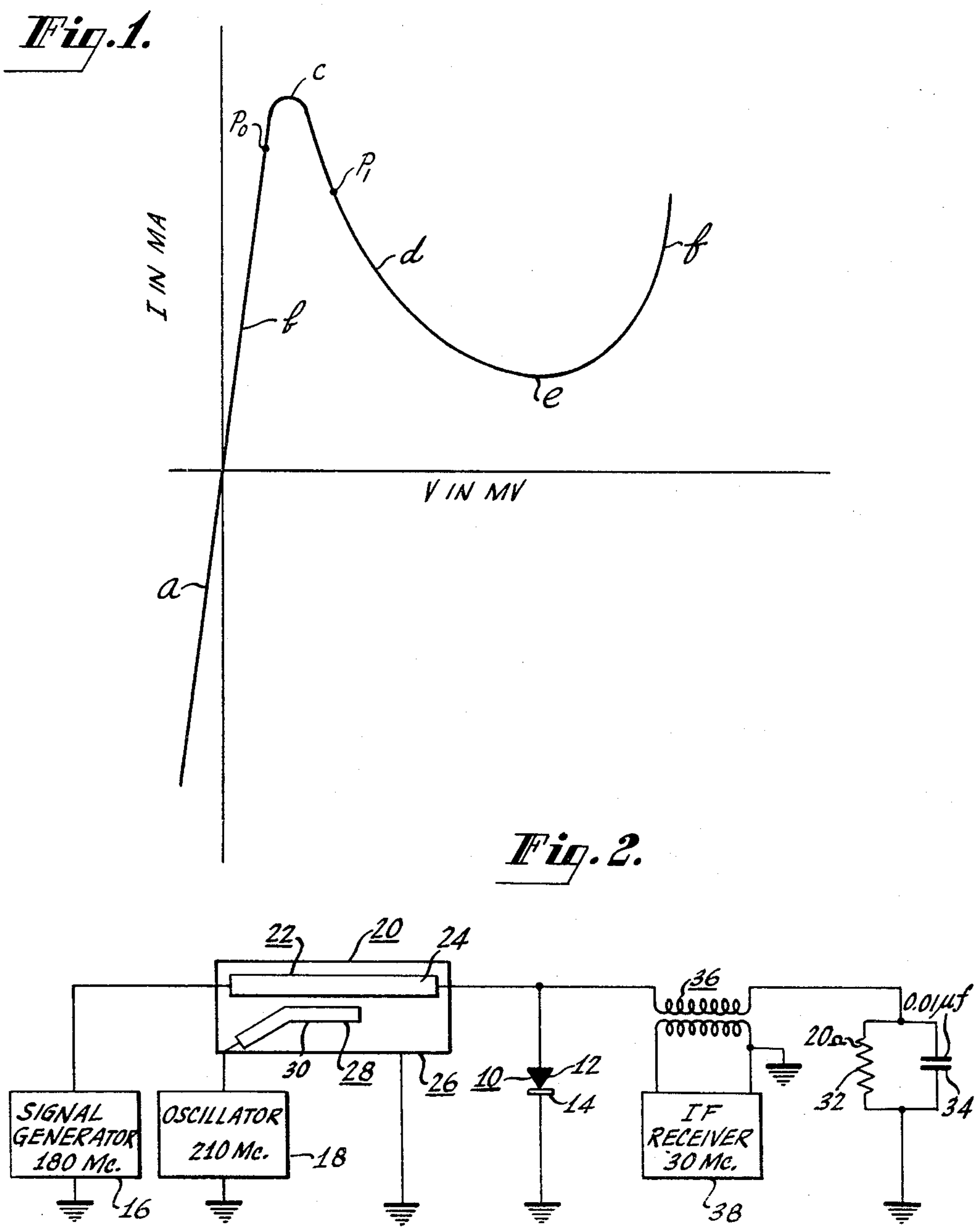
FIGURE 1 is a graph illustrating the current-voltage characteristic of a negative resistance semiconductor diode of the type employed in the invention.
FIGURE 2 is a schematic circuit diagram, partly in block form, of a frequency converter embodying the invention.

Reference is now made to FIGURE 1, which is a graph illustrating the current-voltage characteristic of a negative-resistance tunnel diode suitable for use in circuits embodying the invention. Such a diode has been described by H. S. Sommers in the article "Tunnel Diodes as High-Frequency Devices," Proc. of the I.R.E., July 1959, page 1201.

For voltages in the back or reverse direction, the reverse current of the diode increases as a function of the voltage as shown by the region *a* in FIGURE 1. The slope of region *a* indicates that the diode exhibits a high positive conductance or low positive resistance in the reverse direction.

For small values of voltages in the forward direction, the initial forward current increases as a function of voltage as is shown by region *b*, the slope of which indicates a high positive conductance. As the forward voltage is increased further, the forward current first reaches a maximum or peak value in region *c*, which includes a region of zero conductance, and then begins to decrease. The decrease in forward current continues throughout the region *d*, which is the negative resistance region, until a current minimum is reached at region *e*. Thereupon the characteristic turns into the usual forward characteristic at region *f* of a semiconductor diode. Region *e* introduces another region of zero conductance in the operation of the diode in the forward direction.

For an applied alternating voltage, the average conductance of the tunnel diode will be greater for excursions of the voltage in the reverse direction than for excursions in the forward direction. Thus a tunnel diode will rectify alternating waves applied thereto and the average D.-C. current flowing through the diode will be in the reverse direction, or from the N type region of the diode to the P type region for conventional current flow.

The slope of the tunnel diode current-voltage characteristic exhibits larger degrees of non-linearity when changing from a positive slope to a negative slope and vice versa as in the regions *c* and *e* respectively of FIGURE 1. Therefore by biasing the diode for operation in such regions, the most efficient mixing or heterodyning of applied signal and oscillatory waves will be obtained. In accordance with the invention, the operating point may be established on either the positive or negative slopes of the diode characteristic adjacent the regions *c* or *e*. However, particularly good operating characteristics of a frequency converter embodying the invention have been observed when the diode is biased for operation near the region *c*.

One embodiment of a frequency converter in accordance with the invention may be seen by referring to FIGURE 2. The frequency converter includes a negative-resistance semiconductor diode 10, such as a tunnel diode, having an anode 12 and a cathode 14. A source of signals, shown herein as a signal generator 16 but which may also comprise a suitable antenna circuit, and a source of locally generated oscillatory waves 18 are coupled to the diode 10 by means of a directional coupler 20. The directional coupler 20 is made up of a main transmission line 22 including a pair of parallel conductors 24 and 26, and a coupling transmission line 28, which includes a conductor 30 and the conductor 26. Thus the conductor 26, which is connected to a point of reference potential or ground in the circuit, functions as the ground plane for both the main and coupling transmission lines 22 and 28. The directional coupler 20 may for example be formed from microstrip transmission line having a pair of parallel, planar, conducting surfaces separated by suitable insulation means.

The signal generator 16 is coupled to the input end of the main transmission line 22 while the local oscillator 18 is connected to the coupling transmission line 28. The diode 10 is coupled to the output end of the main transmission line 22 by connecting the anode 12 thereof to the conductor 24 and the cathode 14 to the conductor 26 or ground. The diode 10 anode is also connected to ground through the primary winding of a transformer 36 and a bias voltage developing circuit which includes the parallel combination of a resistor 32 and a capacitor 34. The secondary winding of the transformer 36 is connected across the input terminals of a utilization circuit 38 which for example may comprise an I-F amplifier or an I-F receiver.

In operation, R-F signals and local oscillatory waves of differing frequencies are applied to the diode 10 by means of the directional coupler 20. The directional coupler 20 provides an insertion loss in the backward direction, i.e. in the direction of wave travel toward the signal generator 16, which is much greater than that in the forward direction, i.e. in the direction toward the diode 10. This directivity of wave travel decouples the local oscillator 18 from the signal generator 16 thereby reducing local oscillator radiation, and also reducing the loading of the signal generator 16 by the local oscillator 18.

The amplitude of the local oscillator 18 wave energy is adjusted to be both substantially greater than that of the signal generator 16 and sufficiently large to cause the diode 10 to conduct more heavily in the reverse direction than in the forward direction. The oscillatory waves are therefore rectified by the diode and a resultant direct current flows through the parallel combination of the resistor 32 and the capacitor 34 to ground. The direction of direct current flow causes a potential drop across the resistor 32 which is of a polarity to forward bias the diode 10. The circuit develops a D.-C. voltage to forward bias the diode 10 to operate in the region *c* of FIGURE 1, such as about the point $P_0$. By way of example, with an oscillator voltage 100 milliwatts, and a tunnel diode having characteristics of the type shown in FIGURE 1, the resistor 32 may be 20 ohms. The smoothing capacitor 34 helps to maintain the forward biasing at substantially a constant magnitude. Thus no external biasing circuit is needed to bias the diode to operate in the nonlinear region *c*.

The excursions of the local oscillator and R-F waves drive the diode 10 through the nonlinear region *c* and into the negative resistance region *d* of FIGURE 1. The excursion through the region *c* causes a nonlinear interaction of the applied signal and local oscillator waves thereby producing sideband frequencies. The excursion into the negative resistance region *d* enables the circuit to exhibit a conversion gain of greater than unity when the amplitude of the local oscillator voltage swing is large enough to drive the diode 10 to any point (such as $P_1$) where the instantaneous value of current through the diode 10 is smaller than the D.C. current at the operating point $P_0$. It is thought that a conversion gain of greater than unity requires that a sufficiently large portion of the oscillatory voltage excursions be in the negative resistance region in order to overcome the losses introduced during the time that the excursions are in the positive resistance regions. The utilization circuit 38, is tuned to select the lower sideband or intermediate frequency which is applied thereto by means of the transformer 36. The primary of the transformer 36 also functions as an R-F choke to prevent signal and oscillatory wave energy from being shunted around the diode 10 through the capacitor 34. The utilization circuit 38, as stated previously, may comprise an I-F receiver which processes the intermediate frequency signal to produce a resultant demodulated output.

Thus in accordance with the invention, a frequency converting circuit employing a tunnel diode develops a self-biasing voltage for the diode which eliminates the necessity of providing an external D.C. biasing source for this purpose. A frequency converter is thereby attained which is not only less susceptible to parasitic oscillations but which additionally is simpler, less bulky and less expensive than previous known negative-resistance diode frequency converters.

Figure 3:
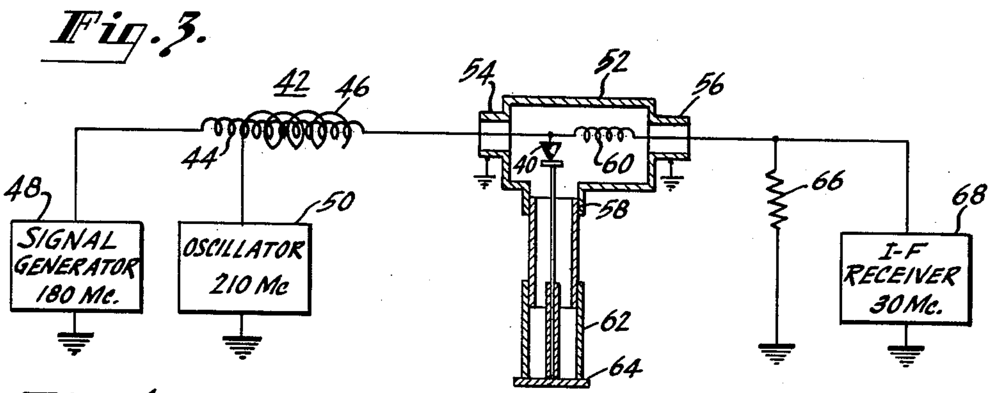
FIGURE 3 is a schematic circuit diagram, partly in block form, of a frequency converter illustrating another embodiment of the invention.

FIGURE 3 shows another embodiment of the invention wherein a directional coupler of the helical type is substituted for the microstrip line in the embodiment of FIGURE 2. Additionally, means for tuning out the reactance exhibited between the terminals of the negative resistance diode are also provided.

Signal and oscillatory waves are applied to a negative resistance diode 40 by means of a helical type directional coupler 42. The directional coupler 42 includes a main helix 44 and a coaxially wound coupling helix 46. A signal generator 48, one terminal of which is grounded, is coupled to the input end of the main helix 44 while a local oscillator 50, one terminal of which is also grounded, is coupled to the input end of the coupling helix 46. The anode of the diode 40 is coupled to the output end of the main helix 44 while the cathode thereof is grounded to complete the A.-C. path.

The diode 40 is mounted in a shielded enclosure, or metal box 52, having a plurality of coaxial connectors 54, 56 and 58 projecting therefrom. The diode 40 is mounted so that the anode thereof makes electrical contact with the inner conductor of the input connector 54 which in turn is connected to the output end of the main helix 44. The anode of the diode 40 is also electrically connected to the inner conductor of the output connector 56 by means of an R-F choke coil 60. The R-F choke coil 60 prevents wave energy at signal and oscillatory frequencies from being shunted around the diode 40. The cathode of the diode 40 is electrically connected to the inner conductor of the connector 58 to which is mechanically fastened a coaxial stub tuning line 62 in a manner such that the inner and outer conductors of the connector 58 and the stub tuning line 62 are electrically connected. A removable cap 64 is provided for the stub line 62 and the inner and outer conductors of the stub tuning line 62 make electrical contact therethrough. The shielded enclosure 52 is grounded, thereby grounding the outer conductors of the coaxial connectors 54 and 56, as well as the outer conductors the stub tuner 62 and the connector 58. The signal output of the negative resistance diode 40 is applied to a resistor 66 which is connected across the terminals of a utilization circuit, such as an I-F receiver, 68.

The operation of this embodiment of the invention is similar to that of the embodiment shown in FIGURE 2 with the capacitance between the inner and outer conductors of the coaxial connector 56 performing the function of the smoothing capacitor 34 of FIGURE 2. In this embodiment, the output of the frequency converter may be optimized by tuning out the reactance exhibited between the terminals of the diode 40. This reactance is primarily composed of the interelectrode capacitance of the P-N junction of the diode and also the inductance of the connecting leads attached thereto. The reactance shunts R-F signals applied to the diode 40 and decreases the output of the frequency converter. By mechanically adjusting the length of the stub tuning line 62 to effect a parallel resonance with diode 40 reactance at the signal frequencies, the shunting effect is reduced and the output of the frequency converter is increased.

Figure 4:
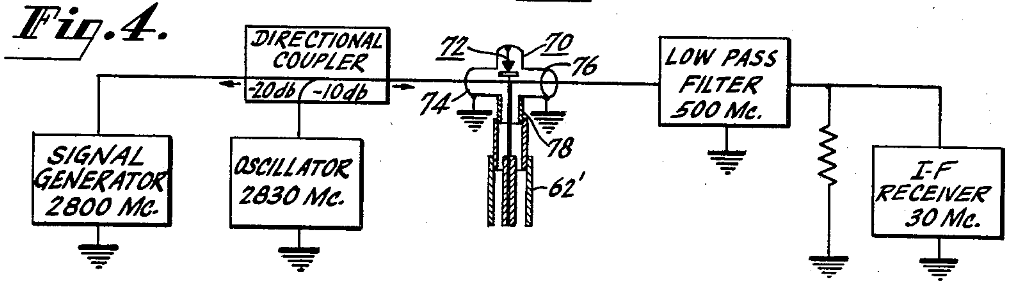
FIGURE 4 is a schematic circuit diagram, partly in block form, of a frequency converter illustrating still another embodiment of the invention.

In the embodiment of the invention shown in FIGURE 4, a BNC type T-junction 70 is provided to obtain a convenient mounting for a tunnel diode 72. The T-junction 70 may be of a commercially available type, such as an I.P.C. No. 27,750 (Industrial Products Corporation), which contains in addition to input and output connectors 74 and 76 respectively a connector 78 to which an adjustable stub tuning line 62', similar to the stub tuning line 62 of FIGURE 3, may be mechanically and electrically connected.

Figure 5:
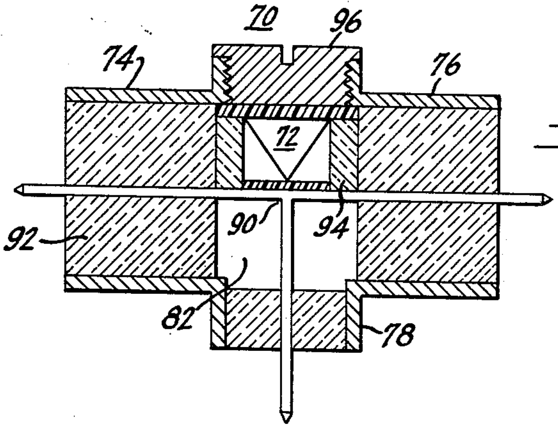
FIGURE 5 is a sectional view of the mounting means for the negative resistance diode used in the frequency converter shown in FIGURE 4, with the diode shown in schematic form.

As shown in FIGURE 5, the T-junction 70 contains a central shielded chamber 82 wherein the inner conductors of input and output connectors 74 and 76 join with the inner conductor of the connector 78 at a central junction point 90. Electrical insulating means 92 which support and insulate the inner conductors of the connectors 74, 76 and 78 from the outer conductors thereof provide suitable walls or boundaries for the chamber 82.

An annular insulating spacer 94, made of a material such as Teflon, is dimensioned to be inserted into the chamber 82 and to receive the tunnel diode 72. The diode 72 is shown in schematic form for clarity. The diode 72 is inserted in the spacer 94 so that the cathode makes electrical contact with the junction point 90. The T-junction 70 is also provided with a set screw 96 which, when screwed thereon, rigidly secures the diode 72 within the chamber 82. Thus in this embodiment of the invention, the anode of the diode 70 is electrically connected to the outer conductors of the coaxial connectors 74, 76 and 78 which in turn are grounded. Therefore to prevent a direct short circuit from appearing across the diode 72, the end of the stub tuning line 62' is left open for direct current as shown in FIGURE 4.

Figure 6:
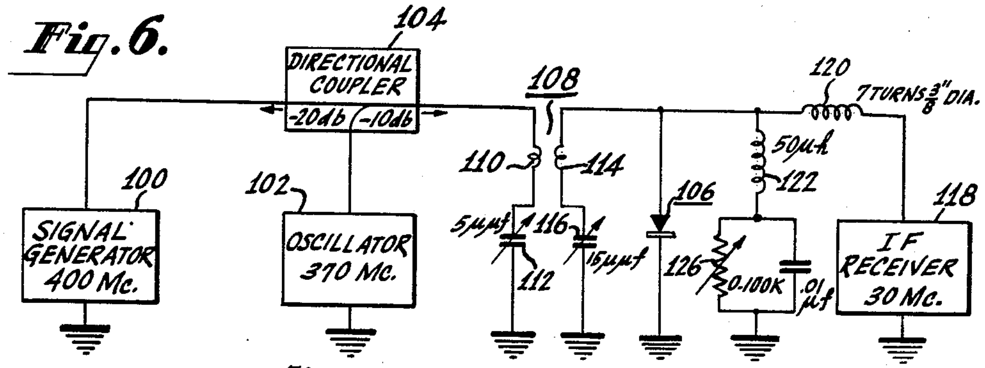
FIGURE 6 is a schematic circuit diagram, partly in block form, of a frequency converter illustrating still another embodiment of the invention.

FIGURE 6 shows an embodiment of the invention in which low noise operation of a frequency converter in accordance with the invention is obtained. Wave energy from a signal generator 100 and a local oscillator 102 are applied to a standard directional coupler 104, the output of which is coupled to a tunnel diode 106 through an impedance transformer 108. The primary of the transformer 108 includes the series combination of a fixed inductor 110 and a variable capacitor 112, while the secondary includes the series combination of a fixed inductor 114 and a variable capacitor 116. The tunnel diode 106, which is connected across the secondary of the transformer 108, is coupled to a utilization circuit, such as an I-F receiver, 118 through an inductor 120.

A bias voltage developing circuit including an R-F choke coil 122 and a parallel combination of a fixed capacitor 124 and a variable resistor 126 are connected in series with each other and across the diode 106.

Both the primary and secondary inductors 110 and 114 respectively of the transformer 108 comprise a ⅛" copper ribbon formed into a single loop having a ½" diameter. The inductors are spaced ¹⁄₁₀" apart from each other.

As is more fully explained in the article "Low-Noise Tunnel-Diode Down Converter Having Conversion Gain" Proc. of the I.R.E., May 1960, low noise operation of a frequency converter may be attained under the following conditions:

$$\frac{|G_o|}{G_g}$$

should be small, approximately equal to 0.1 or .01, and $$\frac{G_e}{|G_o|}$$

should be equal to or less than 1 where $|G_o|$=absolute value of conductance exhibted by the tunnel diode at the operating point $G_g$=output conductance of the signal generator $G_e$=equivalent shot noise conductance of the tunnel diode.

However for a signal generator output impedance of 50 ohms, the $G_g$ thereof equals .02 mho. With an operating point in the region *c* of FIGURE 1 exhibiting a $|G_o|$ approximately equal to .01 mho the ratio $$\frac{|G_o|}{G_g}=\frac{.01}{.02}=.05$$

which is too high. Therefore to reduce this ratio an impedance transformation is required such that a $G_g$ of 1 mho is reflected across the diode 106. The double tuned circuit of the transformer 108 in FIGURE 6 was adjusted to effect this impedance transformation. Furthermore with a $|G_o|=.01$ mho, $G_e$ should be equal to or less than .01 mho. Since $G_e$ approximately equals $20\times I_0$, where $I_0$ is the equivalent noise current of the tunnel diode, $I_0$ should be equal to or less than .5 milliampere. This condition is met by utilizing a low current tunnel diode.

A frequency converter having the representative values of circuit components shown in FIGURE 6 and using a tunnel diode having a peak current of 1 milliampere exhibited a sensitivity of 0.8 microvolt, a noise figure of 3.8 decibels and a bandwidth of better than 1 megacycle.

Thus a negative resistance diode frequency converter in accordance with the invention eliminates the necessity of providing a separate biasing supply for the diode and provides conversion gain over a relatively broad bandwidth while maintaining a low noise figure.

What is claimed is:

1. A frequency converter comprising in combination a negative resistance diode having a current-voltage characteristic which exhibits a greater current conductivity in the reverse direction than in the forward direction and which has a nonlinear region in the forward current conductive direction, means for applying oscillatory waves to said diode, and means providing a load impedance coupled to said diode for developing a direct voltage thereacross in response to rectification of waves applied to said diode which forward biases said diode to operate in said nonlinear region.

2. A frequency converter as defined in claim 1 including a directional coupler comprising a main helix and a coaxial coupling helix, a source of alternating current signals of a frequency different from the frequency of said oscillation waves coupled to the input end of said main helix, means for applying said oscillatory waves to said coupling helix, said diode connected to the output end of said main helix, a stub tuning line coupled to said diode for tuning out the junction reactance of said diode, and means coupled to said diode for driving an output beat frequency signal resulting from the interaction of said signal modulated waves and oscillatory waves in said non-linear region.

3. A frequency converter comprising in combination means providing a source of signal modulated wave energy, means providing a source of oscillatory wave energy to be heterodyned with said signal modulated wave energy, a tunnel diode coupled to said source of signal modulated wave energy and to said source of oscillatory waves, and a direct current circuit path for said diode including a resistor, the forward bias voltage developed across said resistor as a result of rectification of wave energy applied to said diode being the sole bias voltage applied to said diode.

4. A frequency mixer comprising in combination a negative resistance diode having a current voltage characteristic which exhibits in the forward current conductive direction a nonlinear region including first and second positive conductance regions separated by a negative conductance region and which exhibits in the reverse current conductive direction a positive conductance region having an average conductance which is greater than that of the forward conductance regions, means for applying to said diode signal modulated waves of a first frequency, means for applying to said diode oscillatory waves of a second frequency, means providing a load impedance connected to said diode for developing in response to rectification of said waves by said diode a direct voltage thereacross to forward bias said diode to establish an operating point in said negative conductance region, and means providing an output circuit coupled to said diode for deriving a signal of a third frequency resulting from the interaction of said signal modulated and oscillatory waves in said nonlinear region.

5. A frequency converter as defined in claim 4 including a directional coupler comprising a main transmission line and a coupling transmission line, said signal modulated waves being applied to the input end of said main transmission line, said oscillatory waves applied to said coupling transmission line and said diode coupled to the output end of said main transmission line.

6. A frequency mixer comprising in combination a negative resistance diode having a current voltage characteristic which exhibits in the forward current conductive direction a nonlinear region including first and second positive conductance regions separated by a negative conductance region and which exhibits in the reverse current conductive direction a positive conductance region having an average conductance which is greater than the forward conductance regions, means for applying to said diode signal modulated waves of a first frequency, means for applying to said diode oscillatory waves of a second frequency, means providing a load impedance connected to said diode for developing in response to rectification of said waves by said diode a direct voltage thereacross to forward bias said diode to establish an operating point in the nonlinear portion of said first positive conductance region, said oscillatory waves having an amplitude sufficiently large to drive said diode into said negative conductance region to a point where the instantaneous diode current is less than the current at said operating point, and means providing an output circuit coupled to said diode for deriving a signal of a third frequency resulting from the interaction of said signal modulated and oscillatory waves in said nonlinear region.

7. A frequency converter comprising in combination a negative resistance diode having a current voltage characteristic which exhibits a greater conductivity in the reverse direction than in the forward direction and which has a nonlinear region in the forward current conductive direction, means for applying to said diode signal modulated waves of a first frequency, means for applying to said diode oscillatory waves of a second frequency, said oscillatory waves having an amplitude substantially greater than said signal modulated waves, means providing a load impedance connected to said diode for developing in response to rectification of said waves by said diode a direct voltage thereacross to forward bias said diode to operate in said nonlinear region, and means providing an output circuit coupled to said diode for deriving a signal of a third frequency resulting from the interaction of said signal modulated and oscillatory wave in said nonlinear region.

8. A frequency converter as defined in claim 7 wherein said load impedance comprises the parallel combinator of a resistor and a capacitor.

9. A frequency converter comprising in combination a negative resistance diode having a current-voltage characteristic which exhibits in the forward current conductive direction first and second positive conductance regions separated by a negative conductance region and which exhibits in the reverse current conductive direction a positive conductance region having an average conductance which is greater than the average conductance in the forward direction, a directional coupler comprising a main transmission line and a coupling transmission line, a source of radio frequency signals of a first frequency coupled to the input end of said directional coupler main transmission line, said radio frequency signal source having a given output conductance, a source of oscillatory waves of a second frequency connected to said directional coupler coupling transmission line, said oscillatory waves having an amplitude substantially greater than said radio frequency signals, an impedance transformer coupling said diode to said directional coupler to apply said radio frequency and oscillatory waves to said diode, a load impedance coupled to said diode for developing thereacross a direct voltage which forward biases said diode to operate at a point in said negative conductance region, said diode exhibiting a predetermined absolute value of conductance at said operating point, said impedance transformer transforming said radio frequency output conductance to a value greater than said predetermined absolute value of conductance exhibited by said diode at said operating point, and means coupled to said diode for deriving a signal at a third frequency derived from the interaction of said radio frequency and oscillatory waves in the nonlinear forward conductance region of said diode.

References Cited in the file of this patent

UNITED STATES PATENTS

| | | |
|---|---|---|
| 2,964,637 | Keizer | Dec. 13, 1960 |
| 2,978,576 | Watters | Apr. 4, 1961 |

OTHER REFERENCES

Chang et al.: "Low-Noise Tunnel-Diode Down-Conveter Having Conversion Gain," 1960 International Solid-State Circuits Conference Digest of Technical Papers, Feb. 11, 1960, pp. 46–47.

Chang et al.: "Low-Noise Tunnel-Diode Down Converter Having Conversion Gain," Proceedings of the IRE, May 1960, pages 854 to 858.